United States Patent [19]
Tepman

[11] Patent Number: 5,951,775
[45] Date of Patent: Sep. 14, 1999

[54] APPARATUS FOR FULL WAFER DEPOSITION

[75] Inventor: Avi Tepman, Cupertino, Calif.

[73] Assignee: Applied Materials, Inc., Santa Clara, Calif.

[21] Appl. No.: 08/461,575

[22] Filed: Jun. 2, 1995

Related U.S. Application Data

[63] Continuation of application No. 07/954,860, Sep. 30, 1992, abandoned.

[51] Int. Cl.⁶ .................................................. C23C 16/00
[52] U.S. Cl. ........................................... 118/729; 118/728
[58] Field of Search ................................... 118/715, 719, 118/725, 728, 729

[56] References Cited

U.S. PATENT DOCUMENTS

| | | | |
|---|---|---|---|
| 3,641,974 | 2/1972 | Yamada | 118/725 |
| 5,065,698 | 11/1991 | Koike | 118/715 |
| 5,094,885 | 3/1992 | Selbrede | 118/715 |
| 5,135,629 | 8/1992 | Sawada | 118/715 |
| 5,169,684 | 12/1992 | Takagi | 118/728 |
| 5,192,371 | 3/1993 | Shuto | 118/728 |
| 5,213,650 | 5/1993 | Wang | 118/729 |
| 5,228,501 | 7/1993 | Tepman | 118/728 |
| 5,238,499 | 8/1993 | van de Ven | 118/728 |
| 5,474,612 | 12/1995 | Sato | 118/725 |

FOREIGN PATENT DOCUMENTS

| | | | |
|---|---|---|---|
| 60-96755 | 5/1985 | Japan . | |
| 63-238263 | 10/1988 | Japan . | |
| 63-244617 | 10/1988 | Japan | 118/723 |
| 63-246814 | 10/1988 | Japan . | |
| 2-141575 | 5/1990 | Japan | 118/715 |

*Primary Examiner*—Richard Bueker
*Attorney, Agent, or Firm*—Patterson & Associates

[57] ABSTRACT

A readily removable deposition shield for processing chambers such as chemical vapor deposition (CVD), ion implantation, or physical vapor deposition (PVD) or sputtering chambers, is disclosed. The deposition shield includes a shield of cylindrical configuration (or other configuration conformed to the internal shape of the substrate and the chamber) which is mounted to the chamber for easy removal, such as by screws, and defines a space along the periphery of the substrate support. A shield ring is inserted into the peripheral space and is thus mounted in removable fashion and is automatically centered about the substrate. The shield ring overlaps the cylindrical shield and the substrate support. Collectively, these components prevent deposition on the chamber and hardware outside the processing region. Also, the cylindrical shield and the shield ring may be removed as a unit. Locating means such as pins may be mounted or formed in the support about the periphery of the substrate for centering the substrate. Also, a peripheral groove may be formed in the substrate support peripheral to the substrate, for preventing material deposited on the support peripheral to the substrate from sticking to the substrate. The substrate is supported on spacers mounted on the substrate support; the resulting gap between the substrate and the support also prevents the material deposited on the support from bonding to the substrate. The result of the various features is an effective shield which allows long intervals before the shield must be removed for cleaning or replacement and which is easy to remove when necessary. In addition, the entire upper surface of the substrate is available for processing.

14 Claims, 2 Drawing Sheets

APPARATUS FOR FULL WAFER DEPOSITION

This application is a continuation of application Ser. No. 07/954,860, filed Sep. 30, 1992, now abandoned.

BACKGROUND OF THE INVENTION

This invention relates generally to deposition shields for processing chambers, including for example physical vapor deposition or sputtering chambers, chemical vapor deposition chambers and ion implantation chambers. In addition, my invention relates for example to chambers used for the formation of integrated circuits or integrated circuit components on substrates such as semiconductor wafers.

DESCRIPTION OF THE RELEVANT TECHNOLOGY

In deposition processes, species from a source such as a target, a gas inlet manifold, etc. may deposit on exposed internal chamber surfaces, including the chamber walls and hardware. Shields are available which are designed to intercept such species. However, to my knowledge, the available shields have not been successful in completely blocking unwanted deposition. Also, such shields may be difficult and/or time-consuming to replace, and require relatively frequent replacement. The use of automatic substrate exchange systems, with their attendant in- chamber movable components, increases the difficulty of attaining adequate shielding and easy replacement.

SUMMARY OF THE INVENTION

In one aspect, my invention is embodied in a shield arrangement for preventing deposition on adjacent chamber regions during processing of a substrate in a chamber. The shield arrangement comprises a wall-like member surrounding the substrate, a substrate support which may extend laterally beyond the substrate, and a shield ring configured to overlap the substrate support and the shield member, for cooperatively shielding the chamber outside the processing region from deposition. These components are configured for easy removal from the chamber. For example, the shield ring is configured to allow removable positioning of the ring between the wall and the substrate. Also, in a preferred embodiment, the shield member and the shield ring may be removed and replaced as a unit. In another aspect, the shield ring may include an inwardly extending roof for shielding the region of the substrate support adjacent the edge of the substrate from deposition.

In another aspect, the substrate is supported by spacer means mounted on the substrate support which provides a gap between the substrate and the support. The gap eliminates bonding between the deposited material and the substrate and between the substrate and the support and facilitates deposition and processing along the entire upper side of the substrate.

In yet another aspect, my invention is embodied in a combination which comprises: a chamber having internal walls surrounding a processing region; a support for mounting a substrate at a given substrate support position within the processing region; and a shield including a wall surrounding the substrate support position for shielding the chamber internal wall to prevent deposition thereon during processing of the substrate. The shield also includes a vertical flange adjacent the periphery of the substrate mounting position and spaced a given distance from the edge of the substrate support; and a shield ring which comprises a downward extending flange for removable centering of the ring in the space between the shield flange and the substrate holder, and an inwardly extending roof for shielding the region adjacent the periphery of the substrate from deposition.

The substrate support may include substrate locating or centering means mounted along the periphery of the substrate for engaging the peripheral edge of the substrate to center the substrate at the given substrate mounting position. The substrate support also may include a groove or channel extending along the periphery of the substrate mounting position for allowing deposition on the support peripheral to the substrate without interfering with the substrate on the support. Preferably, when the groove is used, the locating means is a plurality of elongated pins mounted at spaced locations along the groove.

Useful materials for my shield system include stainless steel, aluminum, titanium and copper.

My shield system including the shield ring is effective and easily removed for cleaning and/or replacement. Features such as the grooved substrate support increase the processing time between cleaning. In addition, other components, including the substrate centering means and the shield components including the removable ring, provide a shielded substrate support system which is especially tailored to eliminate build-up of deposits that would interfere with the support of the substrate. Uniquely, features such as the gap between the substrate and its support permit the entire upper surface of the substrate is available for deposition and processing.

BRIEF DESCRIPTION OF THE DRAWING

The above and other aspects, features and advantages of my invention are described below with respect to the drawing, in which.

DETAILED DESCRIPTION OF THE PREFERRED EMBODIMENT(S)

Figure 1:
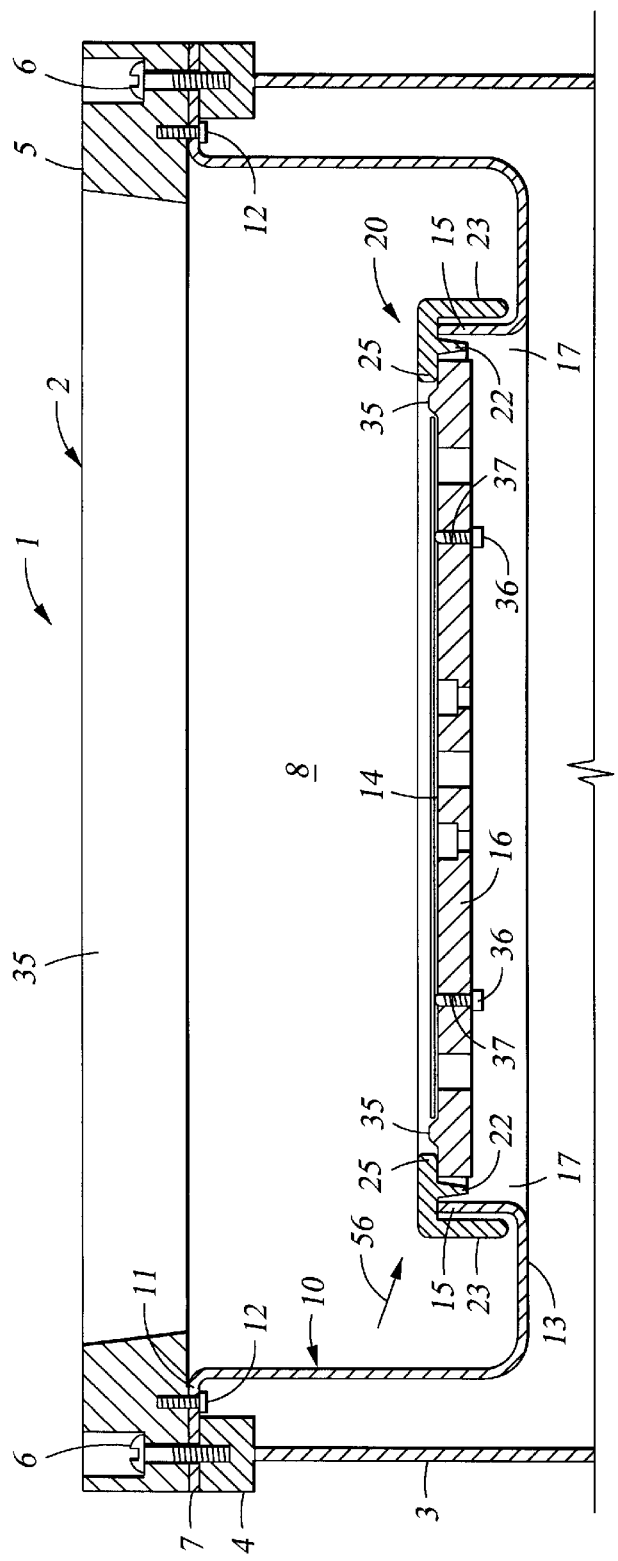
FIG. 1 is a schematic simplified partial vertical section view of a shielded processing chamber which embodies my present invention.

FIG. 1 is a simplified schematic drawing which illustrates an embodiment 1 of my invention incorporated in a deposition chamber. My invention effectively shields the chamber and internal hardware from deposition, yet affords easy removal of the shield components for cleaning or replacement. My invention also permits full wafer deposition, that is, deposition over the entire surface of a substrate 14 such as a semiconductor wafer. My invention is applicable to deposition chambers generally, including for example physical vapor deposition or sputtering chambers, chemical vapor deposition chambers, and ion implant chambers.

By way of example, FIG. 1 illustrates a sputtering chamber 2. The substrate 14 is positioned adjacent chamber processing region 8 on a support member 16 such as a susceptor or a pedestal. By way of example, the diameter of the support member 16 is greater than that of the wafer 14. In the exemplary arrangement, the wafer support member 16 may be attached, as by a plurality of screws 9—9, FIG. 2, to a conventional vertically movable elevator system 18. (Please note, hardware such as gas inlet manifolds and/or sputtering targets is omitted for clarity.)

The exemplary sputter chamber 2 includes a cylindrical chamber wall 3 and a support ring 4 which is mounted to the top of the chamber wall, as by welding. An adaptor plate 5 which may form the top wall of the chamber 2 is attached to the support ring 4 by a plurality of screws 6—6. O-ring 7 provides an hermetic seal. A deposition source (not shown) such as sputtering target assembly or a gas inlet manifold may be mounted in recess 35 and sealed from the ambient. A wall-like cylindrical shield member 10 is mounted to the support ring 4. That is, the cylindrical shield 10 has an outwardly extending upper lip 11 which is attached to the bottom of the adaptor plate 5 by a plurality of screws 12—12. A flange 15 extending upwardly from the annular bottom wall 13 of the shield member 10 surrounds the periphery of the substrate support member 16, leaving a space 17 between the shield flange 15 and the support 16.

My deposition shield 1 also includes an annular shield ring 20 having an inner diameter which is selected so that the ring fits peripherally over the support 16 adjacent to the substrate 14. The ring 20 comprises a downward extending, tapered centering flange 22 which fits into the opening 17 between the flange 15 and the side edge of the substrate support 16, and a second, outer flange 23 which is generally parallel to flange 22. The shield ring 20 is mounted in removable fashion at the periphery of the substrate 14 by seating the two flanges over the mating flange 15 of the cylindrical shield means 10, with the tapered centering flange 22 extending into the opening 17. The shield ring 20 also comprises a raised, inward-extending roof 25 which protects the periphery of the substrate from species traveling inwardly, for example, along direction 56, and prevents deposition on the surfaces on which the shield ring 20 rests and on the associated ring-surface interfaces.

As mentioned, my shield uniquely combines full effective shielding of the chamber with easy removal. Specifically, effective shielding action is provided by the cylindrical shield member 10, the relatively wide substrate support member 16 (that is, the support which extends laterally beyond the substrate) and the shield ring 20, which overlaps both the substrate support and the inward-extending bottom section of the shield member 10. These overlapping components combine to isolate the processing region of the chamber 8 from the rest of the chamber interior and shield the rest of the chamber (for example, chamber walls such as 3 and the internal chamber hardware such as the movable elevator 18 beneath the support member 16) from deposition. The shield components are easily removed, by removing the adaptor plate mounting means such as the screws 6—6 and lifting out as a unit the adaptor plate 5; the shield member 10, which is attached to the adaptor plate; and the shield ring 20, which is supported in removable fashion on the shield member 10. The dual-function substrate support member and shield component 16 is then easily removed by removing the three mounting screws 9—9, FIG. 2. Alternatively, the shield ring 20 can be removed by simply lifting the ring out of the locating space 17, or the shield ring can be removed to permit removal of the substrate support member 16, if desired, without removing the shield 10. Obviously, the shield components are replaced for example by attaching the substrate support member 16 using screws 9—9, and inserting the shield unit and attaching the unit via screws 6—6.

Figure 4:
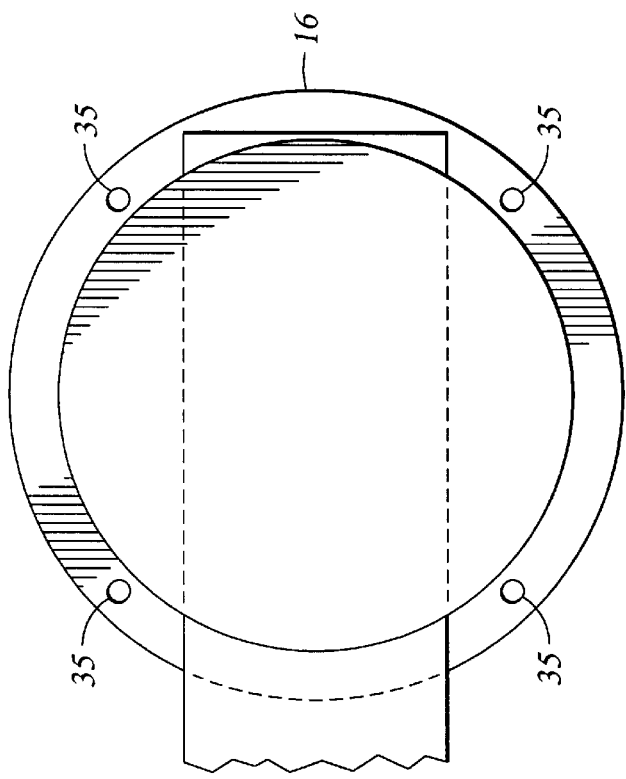
FIG. 4 is a simplified schematic representation of the relationship of the wafer, the wafer support member, the wafer centering or locating means, and a robot transfer blade.

In accordance with another aspect of my invention, substrate locating or centering means such as protrusions or bumps 35—35 (see FIG. 4 as well as FIG. 1) are formed in the upper surface of the substrate support member 16 peripheral to the mounting position of the substrate 14 for precisely centering the substrate on the support. As shown in FIG. 4, four alignment bumps 35—35 are positioned at 90° intervals in a rectangular array, to effect the positioning function 360° about the periphery of the wafer 14. The locating means limits lateral movement of the wafer 14 relative to the substrate support member 16 and thus ensures that the wafer is positioned at the desired location on the substrate support member for processing and ensures that the wafer is in position on the support member for pick-up by the robot blade 34. The locating function permits full wafer deposition, that is, deposition over the entire surface of a substrate such as wafer 14, without using edge clamps, or where clamps are not required. Preferably, the alignment bumps 35—35 are rounded (for example, hemispherical) to avoid sharp corners which can cause particles to flake off into the processing environment.

Figure 2:
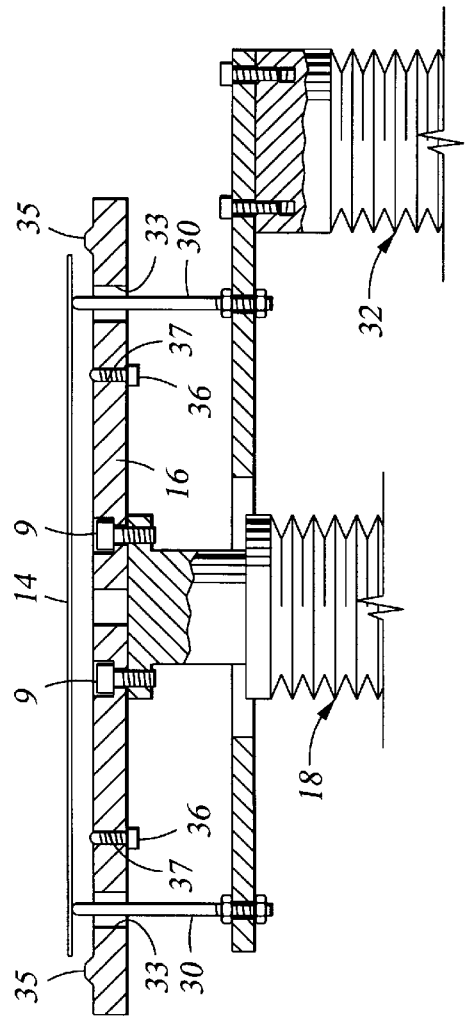
FIG. 2 is a schematic simplified partial vertical sectional view of an automatic substrate exchange system.

Referring to FIGS. 1, 2 and 4, in the illustrated chamber system 2, the substrate support 16 is mounted to the elevator 18 for vertical movement relative to an arrangement of pins 30—30 which themselves are moved vertically by a second vertical lift or elevator mechanism 32. The coordinated vertical movement of the substrate support 16 and the substrate support pins 30-30 (which extend through holes 33—33 in the substrate support) in combination with the coordinated horizontal movement of a substrate transfer blade 34, FIG. 4, transfers substrates into and out of the chamber and onto and off the substrate support 16. In addition, vertical movement of the substrate support member 16 by elevator 18 permits precise positioning of the substrate relative to the source such as a gas inlet manifold and/or a sputtering target. This type of automatic substrate exchange and positioning system is known in the art and is described for example in commonly assigned U.S. Pat. No. 4,951,601 issued Aug. 28, 1990 to inventors Maydan et al.

Despite the complications provided by the above-described moving parts, my deposition shield system 1 provides effective shielding against unwanted deposition and is readily removable and replaceable. Please note, although the illustrated cylindrical shield system 1 is configured for a circular semiconductor wafer, other shield configurations may be used as required to conform to other substrate and chamber configurations.

In accordance with another aspect of my invention, a spacer means, in the form of a plurality of pins 36—36 threaded through mating holes 37—37 in the substrate support member 16, supports the substrate 14 just above the upper surface of that member. In providing a small gap 50 (see FIG. 3) between the support member 16 and the wafer 14, the spacer means prevents material which deposits along the exposed periphery of the support member at the edge of the substrate from bonding to the substrate and from bonding the support member to the substrate. The spacer(s) thus facilitate full wafer deposition. The height of the pins 36—36 preferably provides a gap of about 0.5–1 millimeter between the substrate and its support 16. A gap greater than about 1 millimeter may allow the deposited material to reach the backside of the substrate.

Figure 3:
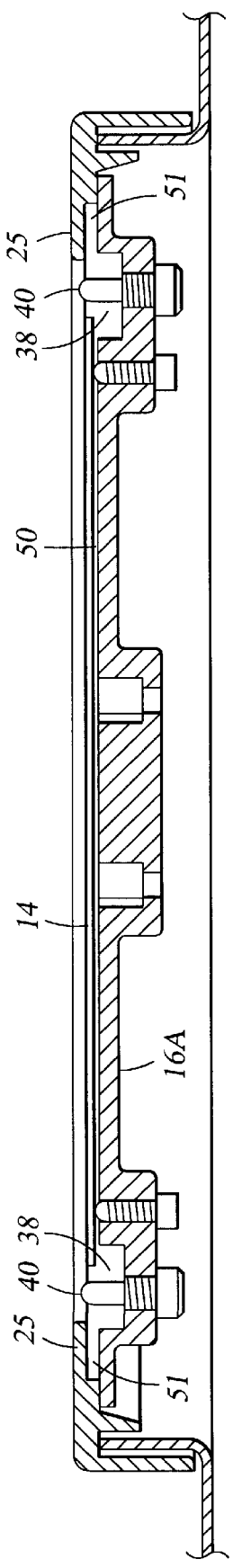
FIG. 3 illustrates an alternative embodiment of the shield arrangement depicted in FIG. 1.

FIG. 3 depicts an alternative shielded substrate support 16A which is preferred for high rate deposition, typically of relatively low stress material such as aluminum and aluminum-containing compounds and materials. Please note, typical processes may deposit about 1000 Angstroms of material per wafer, with the result that perhaps 5000 wafers can be processed before the support or pedestal 16 must be cleaned. Aluminum thickness, however, may be 10,000 Angstroms per wafer. Because of the possible backside deposition, the gap 50 cannot be increased sufficiently to accommodate this increased deposit thickness. Instead, I form a channel or groove 38 in the substrate support 16A along the periphery of the substrate 14. The groove 38 allows additional build-up of deposited material (relative to a planar configuration) on the support 16 along the edge of the substrate 14 without the material sticking to the substrate and without interfering with the positioning and orientation of the substrate on the support.

In the FIG. 3 embodiment, the centering means is located in the groove and, thus, comprises elongated threaded centering pins 40—40 of adjustable length which are attached to the substrate support 16A via threaded holes, instead of the smaller (shorter) centering bumps or protrusions 35—35, FIG. 1. Also, gap 51 between the roof 25 and the substrate support beneath the roof prevents the roof from sticking to the support. In addition, the radial length of the inward extending roof prevents deposited material from reaching the surfaces upon which the roof is supported.

Useful material for the components of my shield system 12 include stainless steel, aluminum, titanium and copper. Stainless steel is a preferred material because it is relatively easy to clean. Aluminum or copper may be preferred when depositing materials such as tungsten which do not stick to stainless steel.

FIG. 4 is a simplified schematic drawing, not to scale, depicting the relationship of the wafer 14, the locating or centering means (35 or 40), the substrate support member 16 and the robot transfer blade 34. In the illustrated embodiment, the locating means comprises four bumps 35—35 spaced at 90° intervals around the near-periphery of the wafer support member 16 for effecting secure positioning 360° around the substrate.

Although operation of the robot blade of the type contemplated here is well known, one mode of operation will be reviewed to ensure understanding of the cooperation among the various components. To position a wafer 14 on the support 16, the wafer is positioned on the robot blade 34 and the blade is inserted into the chamber, typically through a slit valve-controlled opening or other suitable opening (not shown) in the chamber wall, to position the wafer over the retracted (lowered) support 16 and pin array 30—30. The pins 30—30 are raised by elevator 32 relative to the substrate support member 16 to lift the substrate 14 off the robot blade 34. The robot blade is withdrawn and the elevator 32 and pins 30—30 are lowered relative to the substrate support member 16, thereby depositing the substrate onto the spacer support pins 36—36, with the substrate being centered by the locating means 35—35. In the illustrated embodiment, elevator 18 can be used to vary the vertical position of the support 16 and the substrate 14 relative to the processing region or the sputtering source or the gas inlet manifold, etc., to control the fabrication process.

Conversely, to remove the substrate 14 from the chamber after processing, the pins 30—30 are elevated through the holes 33—33 relative to the substrate support member 16, then the robot blade 34 is inserted between the substrate support member and the substrate to lift the substrate off the spacer support pins 36—36. Elevator 32 is actuated to lower the elevator pins 30—30, to deposit the substrate 14 on the robot blade 34 and the robot blade and the substrate are withdrawn from the chamber.

Based upon the above disclosure of preferred and alternative embodiments of my invention, those of usual skill in the art will readily derive alternatives and implement modifications which are equivalent to my invention and within the scope of the claims of this patent document.

I claim:

1. A deposition chamber shield arrangement for limiting the deposition of deposition materials on internal chamber components during the processing of a substrate in the deposition chamber, comprising:

a shield member extending circumferentially around the substrate to prevent deposition on the deposition chamber regions shielded by said shield member during processing of the substrate in the deposition chamber; and a shield ring extending from the shield member terminating adjacent the edge of the substrate, said shield ring contacting an edge region of a substrate support member located adjacent to the periphery of the substrate to prevent the passage of deposition materials past the edge of the substrate support member;

wherein the substrate support member further comprises a channel extending along the periphery of the substrate and a plurality of pins mounted at spaced locations along the channel.

2. The shield arrangement of claim 1, wherein the substrate is positioned in the deposition chamber by the substrate support member, and said substrate support member is positionable in the deposition chamber to position the substrate adjacent said shield ring during the formation of a deposition layer on the substrate.

3. The shield arrangement of claim 2, wherein at least a portion of said support member extends between the edge of the substrate and the shield ring during the formation of a deposition layer on the substrate.

4. The shield arrangement of claim 2, wherein said shield ring includes a roof portion extending over a portion of said support member.

5. The shield arrangement of claim 2, wherein said shield member includes a flange thereon, and said shield ring is releasably received on said flange.

6. The shield arrangement of claim 2, wherein said shield ring includes an alignment member thereon engageable with said support member to align said shield ring with respect to said support member.

7. The shield arrangement of claim 6, wherein said support member includes a substrate alignment member to position the substrate in a desired position on said support member as the substrate is received on said support member.

8. In combination: a chamber having a wall surrounding a processing region; a support for supporting a substrate at a given substrate support position; a wall-like shield surrounding the substrate support position; said shield further comprising a vertical flange adjacent the periphery of the substrate mounting position and spaced a given distance from the edge of the substrate support, and a shield ring including a downward extending flange received by the space between the shield flange and the substrate holder for removable positioning of the shield ring adjacent the periphery of the substrate, the shield ring overlapping the substrate support and the shield; and a spacer mounted on the substrate support to support the substrate with a gap between the substrate and the substrate support, wherein the substrate support further comprises a channel extending along the periphery of the substrate mounting position for allowing deposition on the support peripheral to the substrate without interfering with the positioning of the substrate on the support, and a plurality of pins mounted at spaced locations along the channel.

9. An apparatus for positioning a substrate within a processing chamber, comprising:

a substrate support member disposed within the chamber and positionable within the chamber to receive the substrate thereon and support the substrate in the chamber during processing of the substrate in the chamber; and a substrate positioning member disposed on the support member and positioned to locate the substrate in a desired location on the substrate support member as the substrate is received on the substrate support member, wherein said positioning member includes a plurality of guide pins that extend outwardly from an indentation in the substrate support member.

10. The apparatus of claim 9, wherein said positioning member includes a plurality of alignment bumps extending from the surface of the substrate support member.

11. The apparatus of claim 10, wherein said alignment bumps include a hemispherical profile.

12. An apparatus for positioning a substrate in a processing chamber to form a deposition layer on a deposition receiving face of the substrate, wherein the substrate includes a perimeter extending circumferentially about the deposition receiving face of the substrate, comprising:

a substrate support member disposed within the processing chamber and positionable within the processing chamber to receive the substrate thereon;

said substrate support member including a channel in the substrate support member along the perimeter of the substrate when the substrate is received on said substrate support member, said channel terminating inwardly of the substrate edge and extending partially under the substrate at the perimeter of the substrate.

13. The apparatus of claim 12, wherein said channel extends circumferentially in said support member adjacent the perimeter of the substrate.

14. The apparatus of claim 12, wherein said channel provides a space between the substrate perimeter and adjacent portions of said substrate support member.

\* \* \* \* \*